(12) United States Patent
Chen

(10) Patent No.: US 8,720,843 B1
(45) Date of Patent: May 13, 2014

(54) PROTECTIVE COVER

(71) Applicant: Tsan-Nien Chen, Taipei (TW)

(72) Inventor: Tsan-Nien Chen, Taipei (TW)

( * ) Notice: Subject to any disclaimer, the term of this patent is extended or adjusted under 35 U.S.C. 154(b) by 0 days.

(21) Appl. No.: 13/686,855

(22) Filed: Nov. 27, 2012

(51) Int. Cl.
*A47G 1/24* (2006.01)

(52) U.S. Cl.
USPC ........... 248/455; 248/458; 248/454; 248/457; 248/460; 206/305; 206/320

(58) Field of Classification Search
USPC ......... 248/917–923, 458, 454, 455, 457, 460, 248/441.1, 444, 447, 176.1; 361/679.06, 361/679.26, 679.27, 679.55, 679.56, 679.3, 361/679.44; 206/305, 320
See application file for complete search history.

(56) References Cited

U.S. PATENT DOCUMENTS

| | | | | |
|---|---|---|---|---|
| 2,656,632 | A * | 10/1953 | Detje | 40/790 |
| 4,077,512 | A * | 3/1978 | Heaton | 206/45.2 |
| 5,555,614 | A * | 9/1996 | Book | 29/401.1 |
| 6,307,741 | B1 * | 10/2001 | Karidis et al. | 361/679.27 |
| 7,333,327 | B1 * | 2/2008 | Ho et al. | 361/679.55 |
| 7,735,644 | B2 * | 6/2010 | Sirichai et al. | 206/320 |
| 7,934,689 | B2 * | 5/2011 | Chiu et al. | 248/222.11 |
| 8,230,992 | B2 * | 7/2012 | Law et al. | 206/320 |
| 8,282,060 | B2 * | 10/2012 | Fan | 248/291.1 |
| 8,297,443 | B2 * | 10/2012 | Ogando | 206/750 |
| 8,369,074 | B2 * | 2/2013 | Chou et al. | 361/679.09 |
| 8,467,186 | B2 * | 6/2013 | Zeliff et al. | 361/679.56 |
| 2006/0007645 | A1 * | 1/2006 | Chen et al. | 361/681 |
| 2011/0297564 | A1 * | 12/2011 | Kim et al. | 206/320 |
| 2012/0044638 | A1 * | 2/2012 | Mongan et al. | 361/679.55 |
| 2012/0153116 | A1 * | 6/2012 | Harrison | 248/460 |
| 2012/0170212 | A1 * | 7/2012 | Gallouzi et al. | 361/679.56 |
| 2012/0268891 | A1 * | 10/2012 | Cencioni | 361/679.55 |
| 2013/0077226 | A1 * | 3/2013 | Rayner | 361/679.26 |
| 2013/0083465 | A1 * | 4/2013 | Motoishi et al. | 361/679.21 |

* cited by examiner

*Primary Examiner* — Nkeisha Smith

(57) ABSTRACT

A protective cover structure includes a bottom plate, a coupling plate and a top lid. Two opposite edges of the coupling plate are respectively connected to the bottom plate and a top lid. The bottom plate, coupling plate and top lid are foldable with respect to one another. The bottom plate includes a first bottom board and second bottom board being foldable to each other. A buckling tongue for holding an electronic device is disposed on the first bottom board, and a covering element covering and positioning the electronic device is disposed on the second bottom board. An electronic device can be covered and positioned through the arrangement of the buckling tongue and covering element. When intending to operate the electronic device, a user lifts the top lid and folds and positions it under the bottom plate, or disengage the buckling tongue to release the electronic device, thereby supporting the electronic device in a standing-up use.

9 Claims, 8 Drawing Sheets

PROTECTIVE COVER

FIELD OF THE INVENTION

The present invention relates to a protective cover, and more particularly to a protective cover with a flippable top lid and a buckling tongue capable of fixing and releasing an electronic device for the electronic device to be supported and stood up by the top lid.

DESCRIPTION OF THE RELATED ART

To keep abreast with the continuous progress of information technology, current computer products, such as smart phones, tablet PCs and the like, all follow the trend to be compact, lightweight and multi-functional. The computer products bring mankind unprecedented convenience ever since to all walks of life. Some popular computer applications, such as e-mail, web surfing, photography and e-commerce transactions, can be handled by a single light, thin and portable tablet PC or smart phone.

The whole structure of a tablet PC or smart phone is simplified effectively while the screen size is enlarged simply because the traditional keyboard is replaced by a touch screen. However, the outer surface and screen of a tablet or smart phone is prone to wear-out, defacement or stain while the computer products are being carried. Hence, protective covers and storage bags in a wide variety and great number for tablet PCs and smart phones bring into play to tackle this regard.

One kind of conventional protective covers has a top lid for the protection of the touch screens of the computer products, and a bottom plate being multi-folding and positioned under a covering element for the placement of a device body. A tablet PC or a smart phone can be handheld or stood up while being placed on a table with the bottom plate being folded. Nevertheless, such kinds of covers cannot be fixed very well due to the multi-folding bottom plate. Consequently, when users want to open the top lid to handhold the tablet PC or the smart phone, the bottom plate becomes uncontrollably foldable and even swingable, getting the way of users' hands and causing inconvenience in use. For example, if a protective cover is used for a smart phone, the top lid keeps patting a user's cheek and causes discomfort throughout a phone call when the smart phone is attached to a user's ear to make the phone call.

In view of the foregoing problem, the covering element and the bottom plate provide magnets or Velcro straps for attaching to each other. Although the folding and swinging problem of the bottom plate of a conventional protective cover can be solved by the additional fasteners, such kind of design causes the protective cover to be more complicated in structure and more costly in manufacturing, and the protective cover formed this way lacks texture in appearance.

SUMMARY OF THE INVENTION

In view of the discomfort to users and issues in terms of higher cost and complicated structure, the present invention is proposed to improve the deficiencies.

The main object of the present invention is to provide a protective cover. To achieve the objective, the protective cover has a bottom plate, a coupling plate with one end thereof swingably connected to the bottom plate, and a top lid swingably connected to an opposite end of the coupling plate. The bottom plate, coupling plate and upper plate are foldable with respect to one another, the bottom plate has a first bottom board and a second bottom board. The first bottom board has at least one buckling tongue disposed thereon. The second bottom board has a covering element disposed thereon. At least one buckling mouth respectively engaging the at least one buckling tongue is disposed on the covering element for the at least one buckling tongue and covering element to be formed together. the at least one buckling tongue and covering element define an receiving space and are adapted to fix and receive an electronic device in the receiving space, When the at least one buckling tongue respectively disengages the buckling mouth and the electronic device is released and separated from the at least one buckling tongue, the first bottom board and second bottom board are foldable with respect to each other and are folded to support and stand up the electronic device Given the foregoing protective cover, an electronic device can be covered and positioned through the arrangement of the buckling tongue and covering element during the use of the electronic device. Users can simply uncover and then fold the top lid to position it under the bottom plate, or further disengage the buckling tongue on the first bottom plate from the buckling mouth to release the electronic device from the covering element. Accordingly, the electronic device can be easily stood up for an inclined operation.

DETAILED DESCRIPTION OF THE PREFERRED EMBODIMENTS

Figure 1:
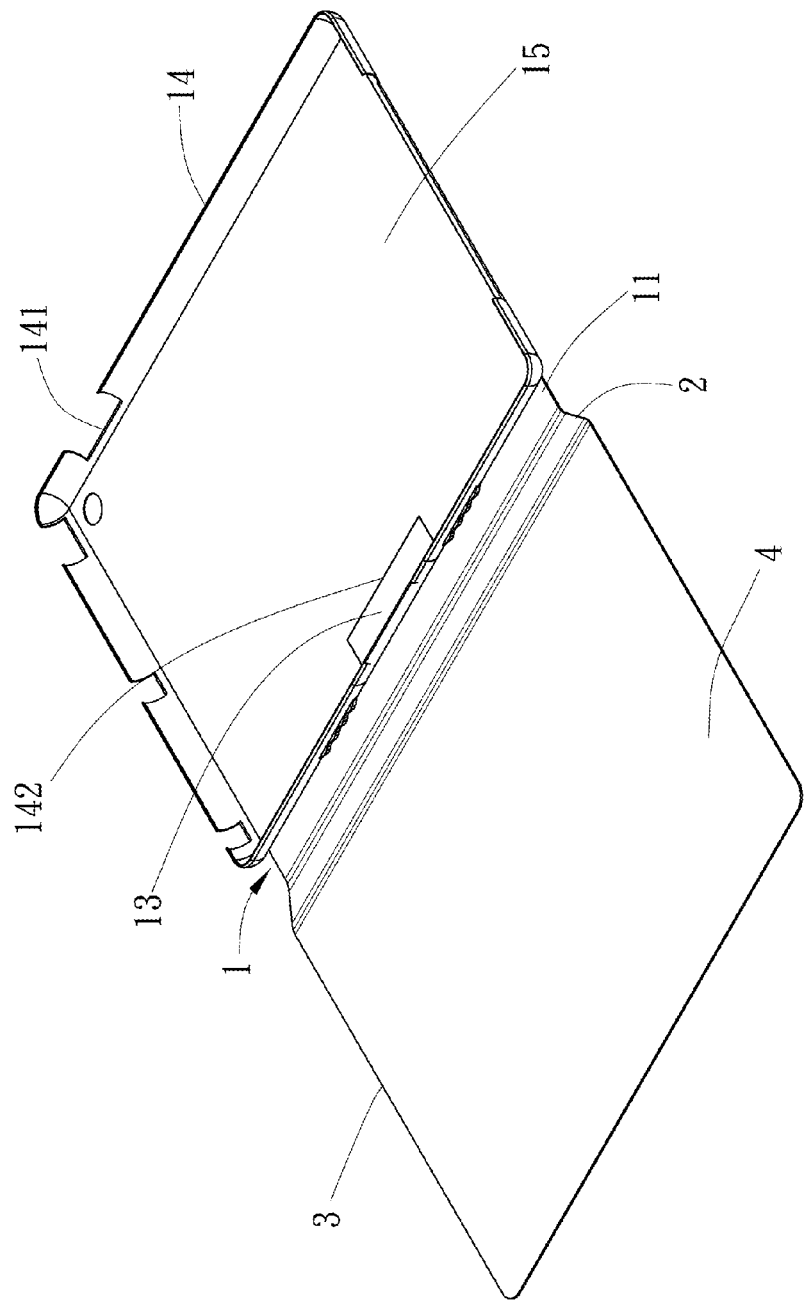
FIG. 1 is a perspective view of a first embodiment of a protective cover according to the present invention.
Figure 2:
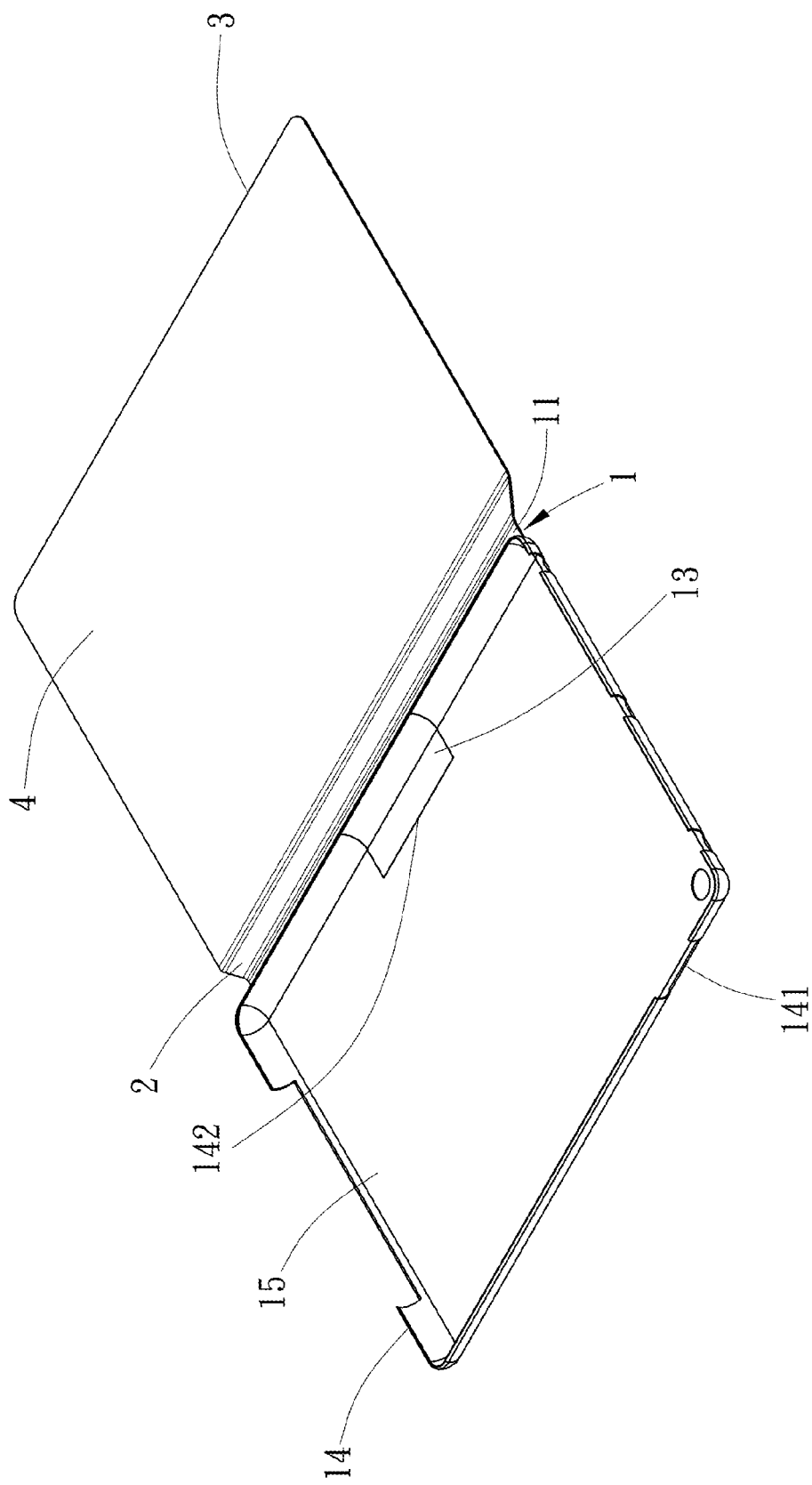
FIG. 2 is another perspective view of the protective cover in FIG. 1.
Figure 3:
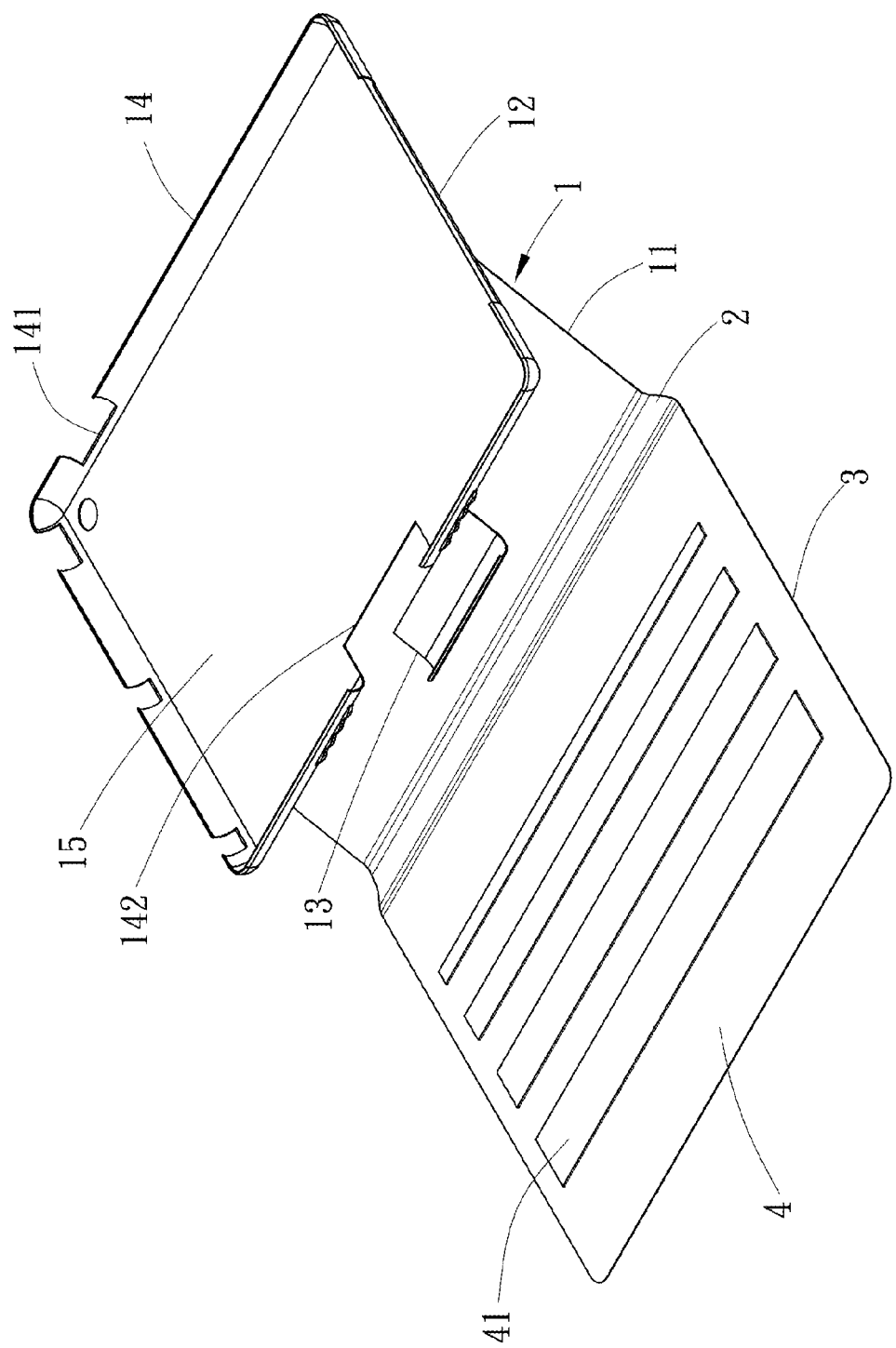
FIG. 3 is an operational perspective view of the protective cover in FIG. 1.

With reference to FIGS. 1 to 3, which respectively are a perspective view, a perspective view observed from another angle of a protective cover structure, and a schematic view of an operational buckling tongue according to the present invention, the protective cover includes a bottom plate 1, a coupling plate 2 and a top lid 3.

The bottom plate 1 includes a first bottom board 11, a second bottom board 12, a buckling tongue 13, a covering element 14 and a receiving space 15. The first bottom board 11 is swingably connected with the second bottom board 12 with one edge of the first bottom board 11 connected with the second bottom board 12. The buckling tongue 13 serves to fix an electronic device, is disposed on the inner face of the first bottom board 11, and is L-shaped observed from a lateral view. The covering element 14 serves to cover and position the electronic device and is disposed on the second bottom board 12. The covering element 14 has a plurality of openings 141 and a buckling mouth 142. The plurality of openings 141 corresponding to buttons or sockets on the electronic device for users to access the buttons or sockets there through are formed through the covering element 14. The buckling mouth 142 corresponding to the buckling tongue 13 is formed through the covering element 14, and engages the buckling tongue 13 on the first bottom plate 11, when the buckling tongue 13 is held within the buckling mouth 142. The receiving space 15 serving to receives an electronic device therein is defined by the buckling tongue 13 and covering element 14 as shown in HG 4. Furthermore, the buckling tongue 13 and the covering element 14 may be made of plastic or metal.

One edge of the coupling plate 2 is swingably connected with the first bottom plate 11.

Figure 4:
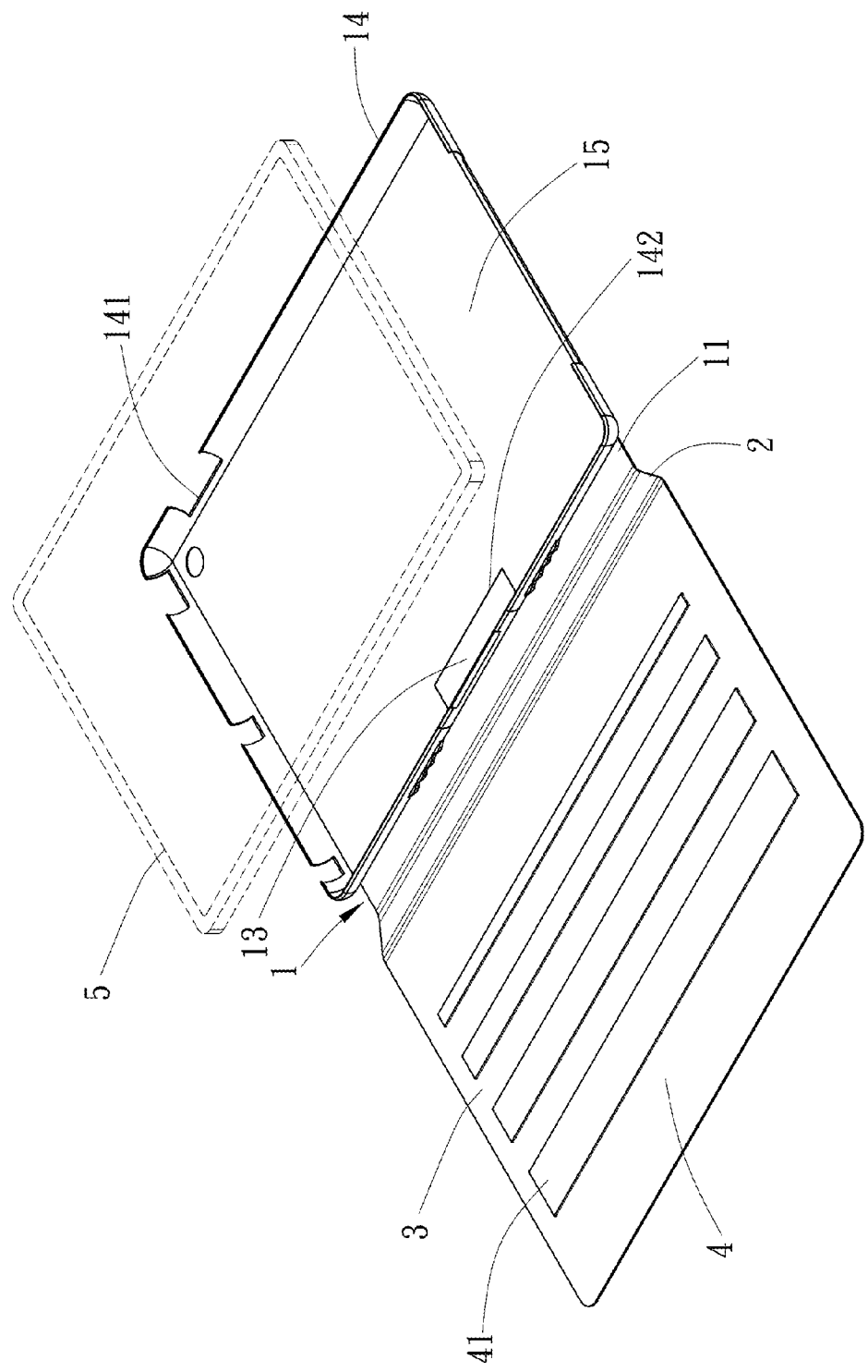
FIG. 4 is a perspective view of the protective cover structure in FIG. 3 receiving a portable electronic device therein.

Furthermore, the top lid 3 is swingably connected to an opposite edge of the coupling plate 2. A non-skid face 4 (as shown in FIGS. 1 and 2) is disposed or a plurality of non-skid protrusions 41 (as shown in FIGS. 3 and 4) are arranged on the top lid 3, where the plurality of non-skid protrusions 41 may be widely spaced from one another by a gap.

Figure 5:
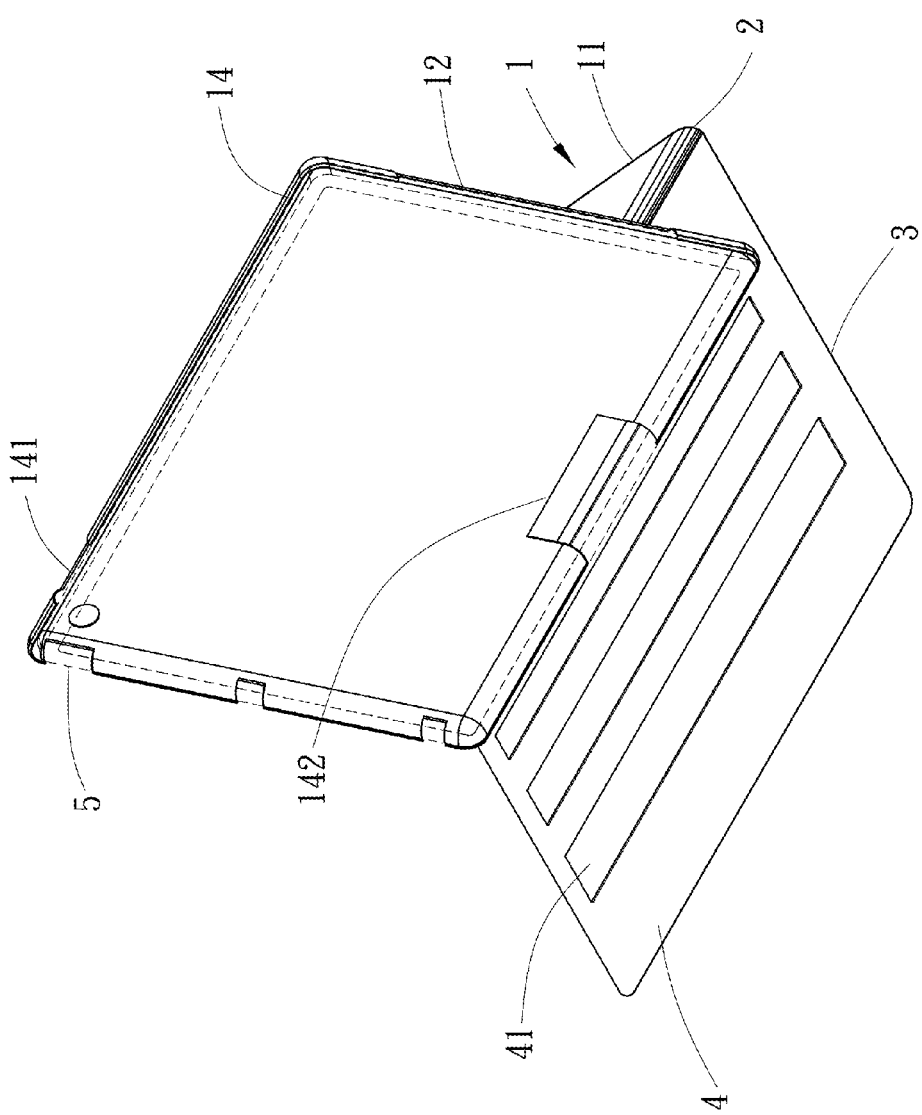
FIG. 5 is an operational perspective view of the protective cover in FIG. 4*receiving* a portable electronic device and standing the portable electronic device up.
Figure 6:
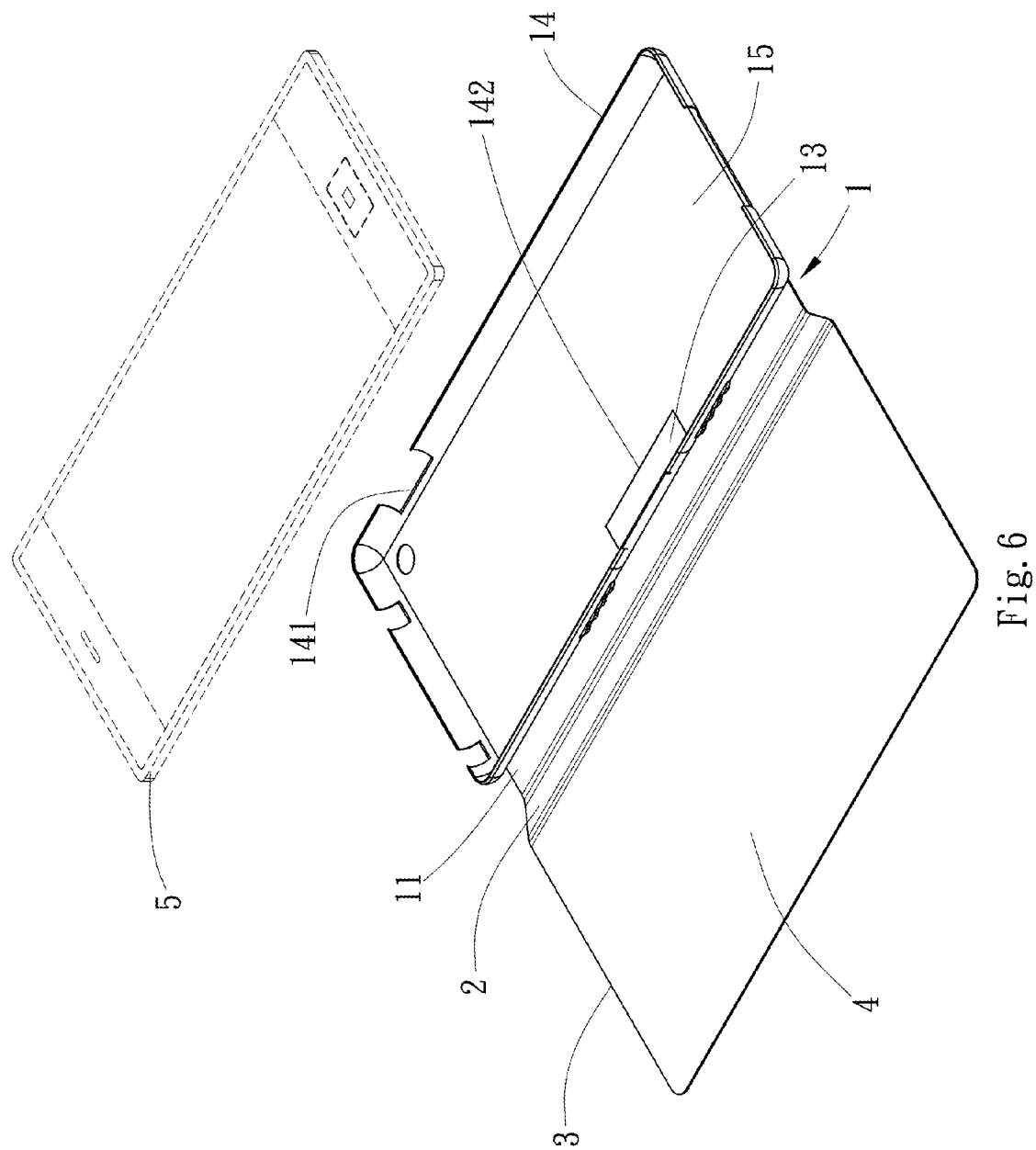
FIG. 6 is a perspective view of a second embodiment of a protective cover receiving a handheld electronic device according to the present invention.

Given the foregoing structure, the protective cover can be formed compactly without the use of additional Vectro tape or magnet between the first bottom plate 11 and covering element 14 as conventional protective covers usually need. The present invention is not only easy in manufacturing but also thin and eye-appealing in appearance. In addition, the protective cover of the present invention may be customized to have the form with a variety of sizes depending on customers' requirements, thereby allowing the electronic devices 5, such as tablets (as shown in FIGS. 4 and 5) and smart phones (as shown in FIG. 6), to be placed therein and providing an eye-appealing appearance and outer surface protection to the electronic devices.

When a user wants to uncover the top lid 3, all users need is to lift the top lid 3 and bend it away from the bottom plate 1, and the electronic device 5 won't escape from the protective cover during the use of the electronic device 5 because the buckling tongue 13 disposed on the first bottom board 11 is capable of holding the electronic device 5 securely. As such, the top lid 3 can be bent away from the bottom plate 1 while the first bottom board 11 does not loosen, fall out or even swing.

Furthermore, when a user wants to stand up an electronic device 5 in an inclined angle, the user lifts the top lid 3 first for the top lid 3 and bottom plate 1 to be unfolded for use. At the moment, the user disengages the buckling tongue 13 from the buckling mouth 142 and the electronic device 5 can then be released, allowing the electronic device 5 covered by the covering element 14 and positioned on the second bottom board 12, and the first bottom board 11 to be foldable with respect to each other. Viewed from a lateral view, a <-shaped structure is formed between the first bottom board 11 and the second bottom board 12. Meanwhile, the electronic device 5 is rested on the non-slip 4 or non-slip body 41 inside the top lid 4 through the covering element 14, and the inclined angle of the electronic device 5 can then be adjusted, further achieving the objective of standing the electronic device 5 up in an inclined angle when the electronic device 5 is operated.

Figure 7:
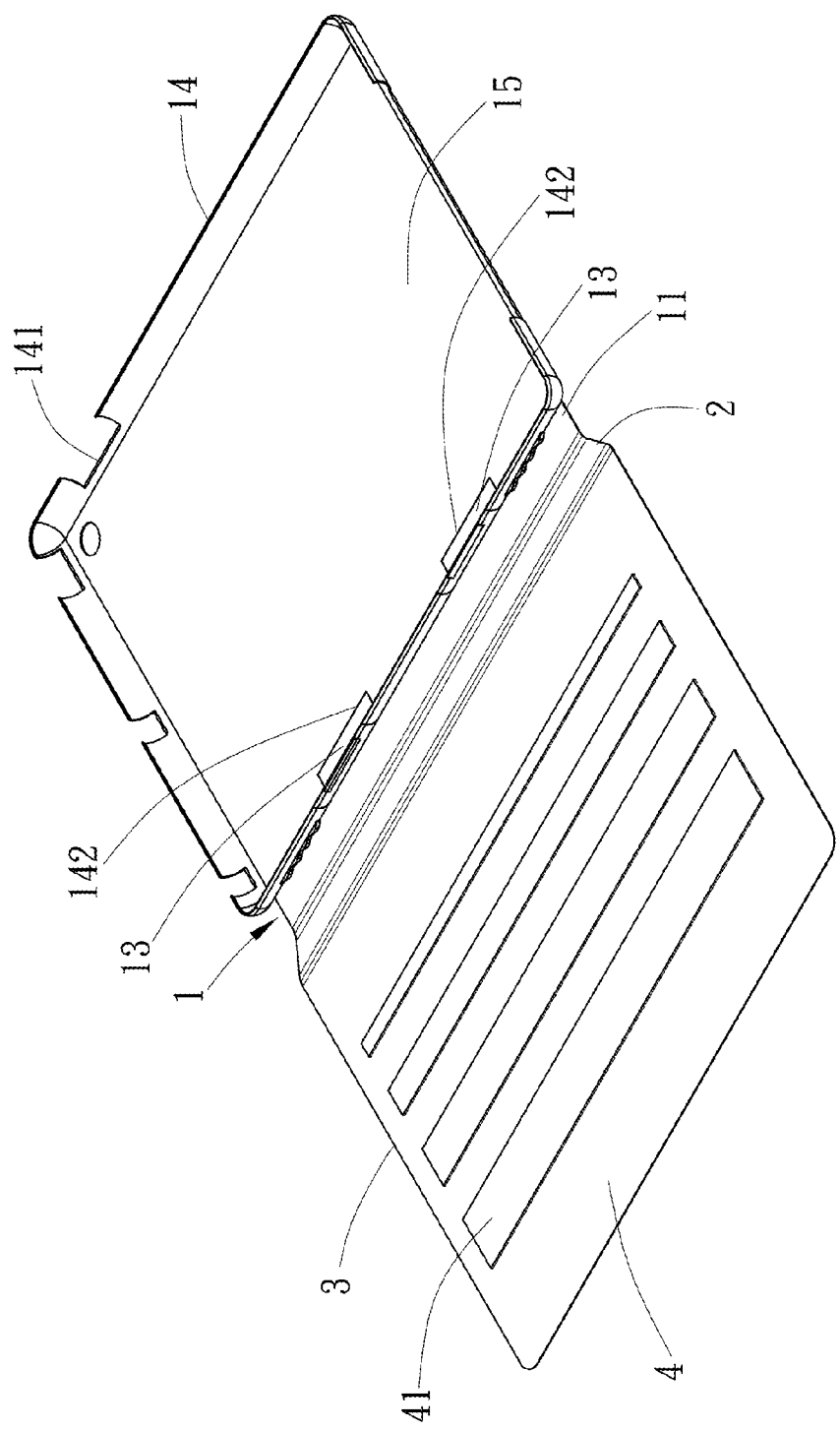
FIG. 7 is a perspective view of a third embodiment of a protective cover according to the present invention.
Figure 8:
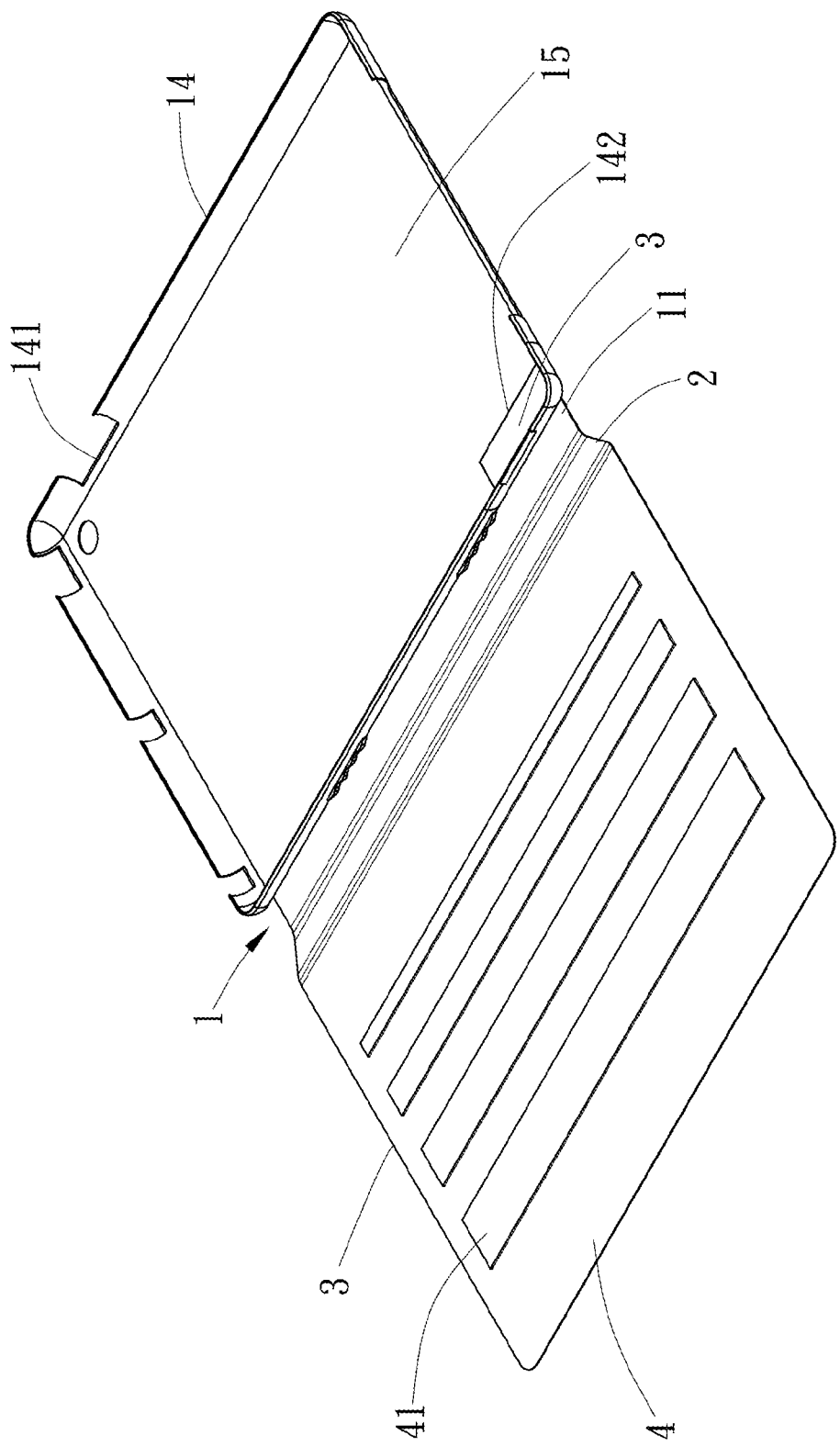
FIG. 8 is a perspective view of a fourth embodiment of a protective cover according to the present invention.

With reference to FIG. 7, which respectively illustrate a practical structure of a protective cover with different buckling position(s), a plurality of buckling tongues 13 may be disposed on a plurality of different positions, to correspond to one edge portion of the electronic device 5, and can be disposed on upper and lower portions of the electronic device 5. With reference to FIG. 8, a buckling tongue 13 may also be disposed on one bottom corner of the electronic device 5. Protective covers can be applied to different electronic devices 5 through the selection of buckling tongue 13 in terms of its number and/or position, thereby increasing the practicality of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A protective cover structure, comprising a bottom plate, a coupling plate with one end thereof swingably connected to said bottom plate, and a top lid swingably connected to an opposite end of said coupling plate, wherein said bottom plate, coupling plate and upper plate are foldable with respect to each another, said bottom plate has a first bottom board and second bottom board, said first bottom board has at least one buckling tongue disposed thereon, said second bottom board has a covering element disposed thereon, the second bottom board and the covering element configured to engage with an electronic device, the covering element configured to form a frame around at least a portion of an edge of the electronic device, the covering element comprising at least one buckling mouth forming an opening in the frame; the at least one buckling mouth respectively engaging said at least one buckling tongue for said at least one buckling tongue and covering element to form the frame together, said at least one buckling tongue and covering element define a receiving space adapted to fix and receive the electronic device in the receiving space and when said at least one buckling tongue respectively disengages the buckling mouth and said electronic device is released and separated from said at least one buckling tongue, said first bottom board and second bottom board are foldable with respect to each other and are foldable to provide a stand for said electronic device.

2. The protective cover as claimed in claim 1, wherein a plurality of openings are formed through the covering element and are adapted for users to access buttons or sockets of the electronic device there through.

3. The protective cover as claimed in claim 2, wherein said at least one buckling tongue and said covering element are made of plastic or metal.

4. The protective cover as claimed in claim 3, wherein said at least one buckling tongue on said first bottom board is L-shaped when observed from a lateral view.

5. The protective cover as claimed in claim 4, wherein said first bottom board has said at least one buckling tongue disposed thereon and adapted to fix a middle portion of a side of the electronic device.

6. The protective cover as claimed in claim 4, wherein said first bottom board has said at least one buckling tongue disposed thereon, and adapted to fix a bottom corner portion of the electronic device.

7. The protective cover as claimed claim 4, wherein said bottom board has a plurality of buckling tongues disposed thereon, respectively fixing an upper side or a lower side of the electronic device.

8. The protective cover as claimed in claim 4, wherein a non-skid face is disposed on an inner side of said top lid.

9. The protective cover as claimed in claim 4, wherein a plurality of non-skid protrusions are spaced from one another by a gap on an inner side of said top lid.

* * * * *